United States Patent
Kato

(10) Patent No.: US 8,872,602 B2
(45) Date of Patent: *Oct. 28, 2014

(54) FILTER MODULE

(71) Applicant: Murata Manufacturing Co., Ltd., Nagaokakyo (JP)

(72) Inventor: Masanori Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/952,918

(22) Filed: Jul. 29, 2013

(65) Prior Publication Data

US 2013/0307638 A1    Nov. 21, 2013

Related U.S. Application Data

(63) Continuation of application No. PCT/JP2012/051441, filed on Jan. 24, 2012.

(30) Foreign Application Priority Data

Feb. 4, 2011    (JP) .................................. 2011-022624

(51) Int. Cl.
*H03H 9/46* (2006.01)
*H03H 9/05* (2006.01)
*H03H 9/60* (2006.01)
*H03H 9/64* (2006.01)
*H03H 9/70* (2006.01)
*H03H 9/72* (2006.01)
*H03H 9/00* (2006.01)

(52) U.S. Cl.
CPC ............... *H03H 9/46* (2013.01); *H03H 9/0571* (2013.01); *H03H 9/0576* (2013.01); *H03H 9/605* (2013.01); *H03H 9/6483* (2013.01); *H03H 9/706* (2013.01); *H03H 9/725* (2013.01); *H03H 9/0028* (2013.01)

USPC ........................... 333/133; 333/134; 333/193

(58) Field of Classification Search
CPC ...... H03H 9/725; H03H 9/706; H03H 9/6483; H03H 9/0576; H03H 9/70
USPC ........................................ 333/133, 132, 126
See application file for complete search history.

(56) References Cited

U.S. PATENT DOCUMENTS 4,746,882 A * 5/1988 Solie .............................. 333/196
2002/0140526 A1   10/2002 Nakamura et al.

(Continued)

FOREIGN PATENT DOCUMENTS

JP    2002-208875 A    7/2002
JP    2003-092526 A    3/2003

(Continued)

OTHER PUBLICATIONS

Official Communication issued in International Patent Application No. PCT/JP2012/051441, mailed on Mar. 19, 2012.

(Continued)

*Primary Examiner* — Stephen Jones
*Assistant Examiner* — Scott S Outten
(74) *Attorney, Agent, or Firm* — Keating & Bennett, LLP

(57) ABSTRACT

In a filter module having excellent phase balance characteristics, a length of a signal path between a first balanced mount electrode and a first balanced terminal electrode is different from a length of a signal path between a second balanced mount electrode and a second balanced terminal electrode. When viewing a mount board from a side on which a filter component is mounted, an area along which the first balanced mount electrode and a first internal ground electrode oppose each other is different from an area along which the second balanced mount electrode and the first internal ground electrode oppose each other.

20 Claims, 9 Drawing Sheets

(56) References Cited

U.S. PATENT DOCUMENTS

| | | |
|---|---|---|
| 2004/0032706 A1 | 2/2004 | Kemmochi et al. |
| 2004/0080385 A1 | 4/2004 | Takamine et al. |
| 2008/0284540 A1 | 11/2008 | Nishihara et al. |
| 2009/0093270 A1* | 4/2009 | Block et al. ............... 455/552.1 |
| 2012/0068788 A1 | 3/2012 | Yamamoto et al. |

FOREIGN PATENT DOCUMENTS

| | | |
|---|---|---|
| JP | 2003-258597 A | 9/2003 |
| JP | 2008-271230 A | 11/2008 |
| JP | 2009-225198 A | 10/2009 |
| JP | 2010-045563 A | 2/2010 |
| WO | 2010/140445 A1 | 12/2010 |

OTHER PUBLICATIONS

Official Communication issued in corresponding German Patent Application No. 11 2012 000 675.5, mailed on Apr. 28, 2014.

* cited by examiner

FILTER MODULE

BACKGROUND OF THE INVENTION

1. Field of the Invention

The present invention relates to a filter module.

2. Description of the Related Art

These days, in communication services provided by, for example, cellular phones, certain measures for an increased number of subscribers are being taken, global roaming enabling the worldwide use of communication services is being developed, the communication quality is being improved, and various contents being transmitted are becoming larger. In order to deal with such communication services, it is necessary that communication devices, such as cellular phones, support multiple bands and multiple systems. Accordingly, in a communication device which supports multiple bands or multiple systems, a plurality of interstage filters or wave splitters are mounted on an RF (Radio Frequency) circuit. That is, interstage filters or wave splitters corresponding to individual bands or individual communication systems are mounted on a communication device.

While the number of interstage filters or wave splitters mounted on an RF circuit is increasing, it is still desirable to reduce the size of a communication device. Accordingly, in order to reduce the size of an RF circuit, a study is being made to mount, on an RF circuit, a filter module constituted by interstage filters, wave splitters, and a plurality of matching devices corresponding to individual bands or individual communication systems. In Japanese Unexamined Patent Application Publication No. 2010-45563, a duplexer module, which is one type of filter module, is disclosed.

FIG. 17 is a schematic plan view of a duplexer module 100 disclosed in Japanese Unexamined Patent Application Publication No. 2010-45563. The duplexer module 100 includes a mount board 101 and first and second duplexers 102 and 103. The first and second duplexers 102 and 103 are mounted on the front surface of the mount board 101. The first and second duplexers 102 and 103 each include an antenna terminal, a transmission terminal, and reception terminals. The mount board 101 includes first and second antenna terminal electrodes, first and second transmission terminal electrodes, and first and second reception terminal electrodes. The first and second antenna terminal electrodes, the first and second transmission terminal electrodes, and the first and second reception terminal electrodes are formed on the back surface of the mount board 101.

The antenna terminal of the first duplexer 102 is connected to the first antenna terminal electrode of the mount board 101. The transmission terminal of the first duplexer 102 is connected to the first transmission terminal electrode of the mount board 101. The reception terminals of the first duplexer 102 are connected to the first reception terminal electrodes of the mount board 101. The antenna terminal of the second duplexer 103 is connected to the second antenna terminal electrode of the mount board 101. The transmission terminal of the second duplexer 103 is connected to the second transmission terminal electrode of the mount board 101. The reception terminals of the second duplexer 103 are connected to the second reception terminal electrodes of the mount board 101.

In order to support a case in which an RFIC of an RF circuit is a balanced input type, a reception filter of the first duplexer 102 is constituted by a longitudinally coupled resonator-type surface acoustic wave filter having a balanced-unbalanced transforming function. That is, the duplexer module 100 is a balanced filter module. Accordingly, the reception terminals of the first duplexer 102 are constituted by a pair of terminals, which are first and second balanced terminals. The first reception terminal electrodes of the mount board 101 are also constituted by a pair of terminal electrodes, which are first and second balanced terminal electrodes. Accordingly, a balanced signal is output from the first reception terminal electrodes of the mount board 101.

In the first duplexer 102, phase balance characteristics of reception signals output from the reception terminals are set to be around 0° in a passband of the reception filter and a passband of a transmission filter.

In the duplexer module 100 configured as described above, the phase balance characteristics of reception signals output from the first reception terminal electrodes of the mount board 101 may become deteriorated.

SUMMARY OF THE INVENTION

In view of the above, preferred embodiments of the present invention provide a filter module exhibiting excellent phase balance characteristics.

A filter module according to a preferred embodiment of the present invention includes a mount board and at least one filter component. The mount board includes a mount electrode layer, an internal electrode layer, a terminal electrode layer, and at least one dielectric layer. The mount board is formed preferably by stacking the mount electrode layer, the internal electrode layer, the terminal electrode layer, and the dielectric layer on each other such that the mount electrode layer is located on a topmost side and the terminal electrode layer is located on a bottommost side of the mount board. At least one filter component is mounted on a front surface of the mount board. At least one filter component includes first and second balanced terminals. The mount electrode layer includes a first balanced mount electrode, which is connected to the first balanced terminal, and a second balanced mount electrode, which is connected to the second balanced terminal. The internal electrode layer includes a first internal ground electrode. The terminal electrode layer includes a first balanced terminal electrode, which is connected to the first balanced mount electrode, and a second balanced terminal electrode, which is connected to the second balanced mount electrode. The length of a signal path between the first balanced mount electrode and the first balanced terminal electrode is different from the length of a signal path between the second balanced mount electrode and the second balanced terminal electrode. When viewing the mount board from a side on which the filter component is mounted, an area along which the first balanced mount electrode and the first internal ground electrode oppose each other is different from an area along which the second balanced mount electrode and the first internal ground electrode oppose each other.

The filter component may preferably be constituted by a surface acoustic wave filter, a boundary acoustic wave filter, or a bulk acoustic wave filter, for example.

The filter component may preferably include a filter portion that performs a balanced-unbalanced transforming function.

According to various preferred embodiments of the present invention, it is possible to provide a filter module exhibiting excellent phase balance characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below through illustration of a duplexer module 1, which preferably is a filter module. However, the duplexer module 1 is illustrated only as a non-limiting example. A filter module according to the present invention is not restricted whatsoever to the duplexer module 1. A filter module according to the present invention may be any type of module as long as a module includes a filter component including first and second balanced terminals, for example, a filter module including a plurality of interstage filters or a filter module including a triplexer.

Figure 1:
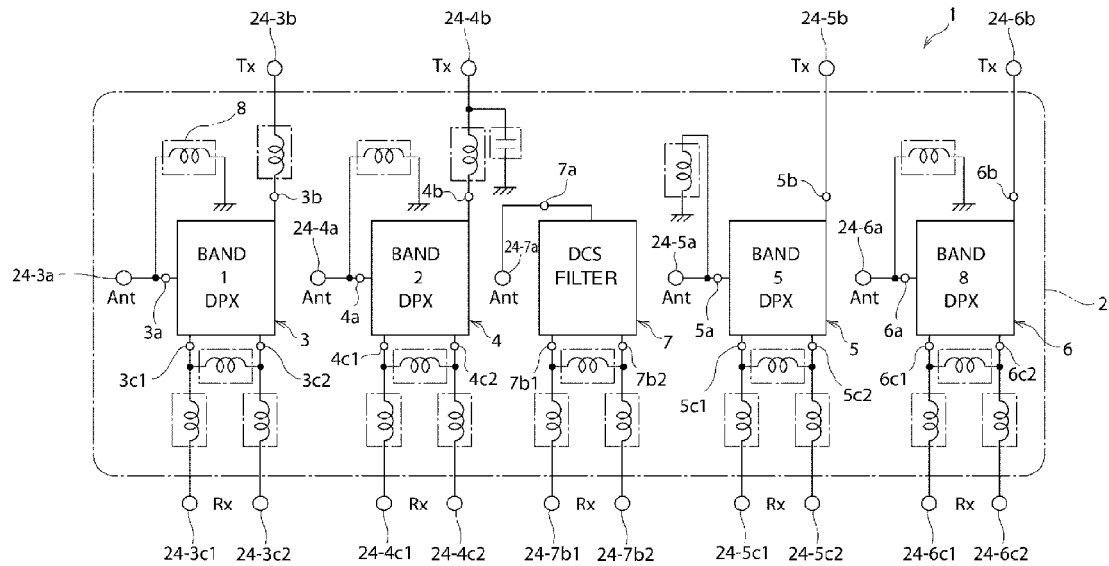
FIG. 1 is a schematic circuit diagram of a duplexer module of a preferred embodiment of the present invention.
Figure 2:
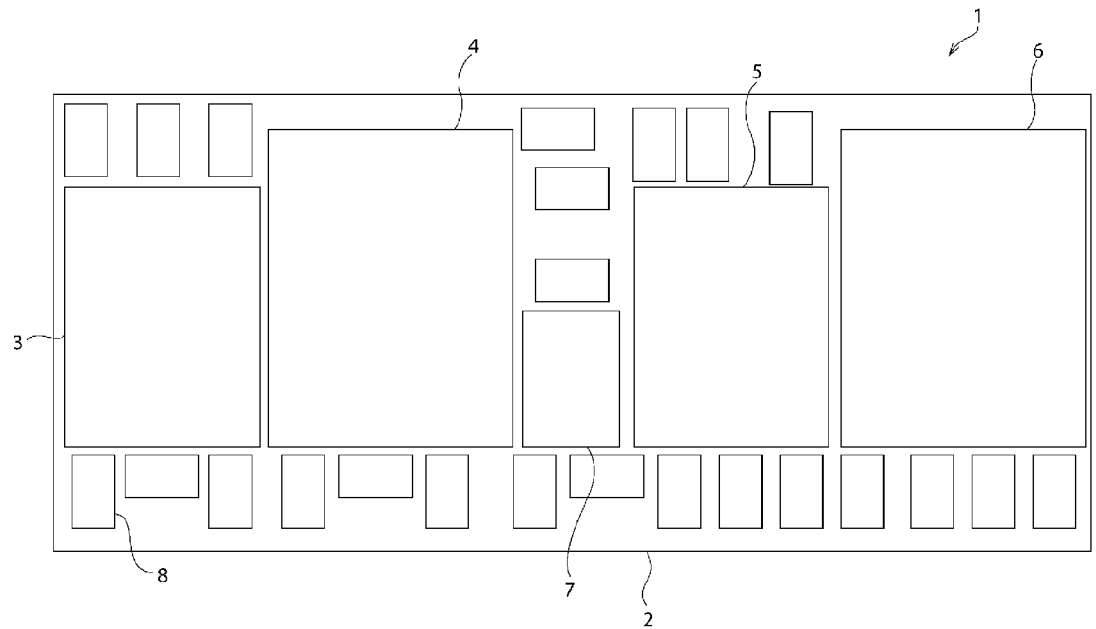
FIG. 2 is a schematic plan view of a duplexer module of a preferred embodiment of the present invention.

The duplexer module 1 of the present preferred embodiment is preferably mounted on an RF circuit of a communication device, such as a cellular phone, for example. FIG. 1 is a schematic circuit diagram of the duplexer module 1 of the present preferred embodiment. FIG. 2 is a schematic plan view of the duplexer module 1 of the present preferred embodiment.

As shown in FIGS. 1 and 2, the duplexer module 1 includes a mount board 2, duplexers 3, 4, 5, and 6, a reception filter 7, and a plurality of chip components 8. The duplexers 3, 4, 5, and 6 and the reception filter 7 are filter components. The chip components 8 are matching devices, such as inductors and capacitors. As shown in FIG. 2, the duplexers 3, 4, 5, and 6, the reception filter 7, and the chip components 8 are mounted on the front surface of the mount board 2 by using, for example, solder.

The duplexer 3 preferably is a duplexer corresponding to UMTS-BAND1. The transmission frequency band of UMTS-BAND1 is 1920 MHz to 1980 MHz, and the reception frequency band thereof is 2110 MHz to 2170 MHz.

Figure 3:
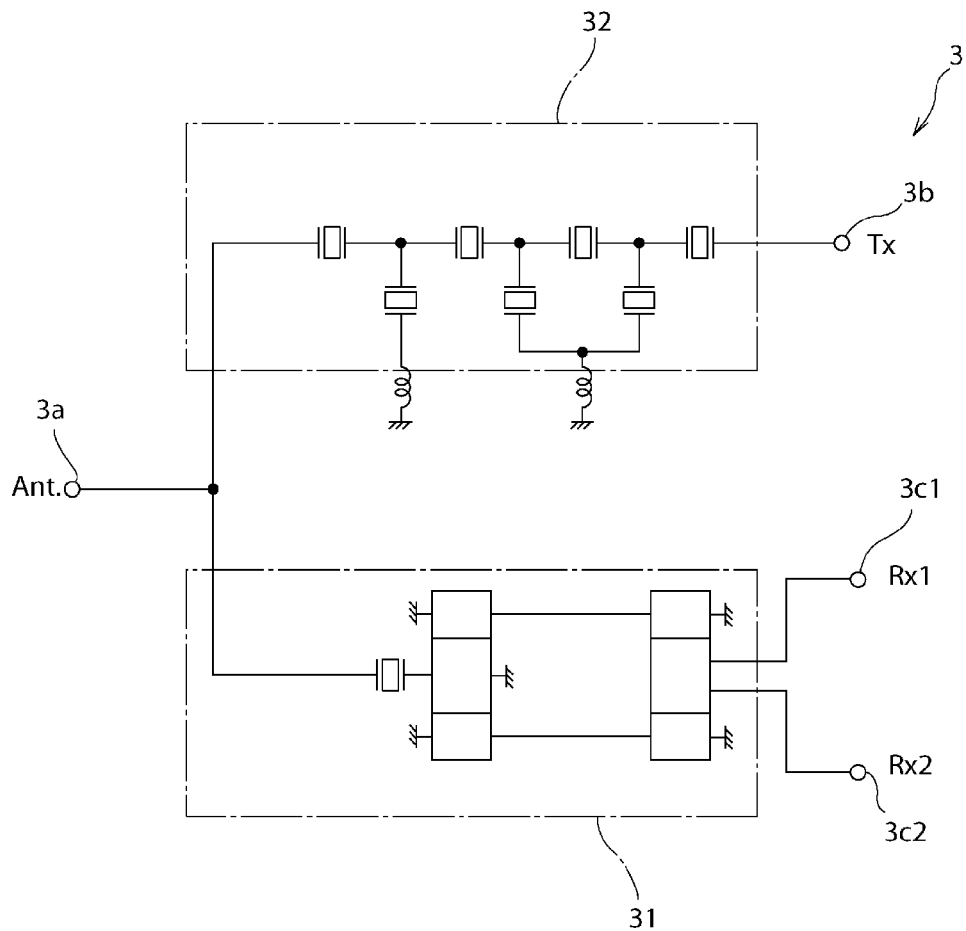
FIG. 3 is a schematic circuit diagram of a duplexer in a duplexer module of a preferred embodiment of the present invention.
Figure 4:
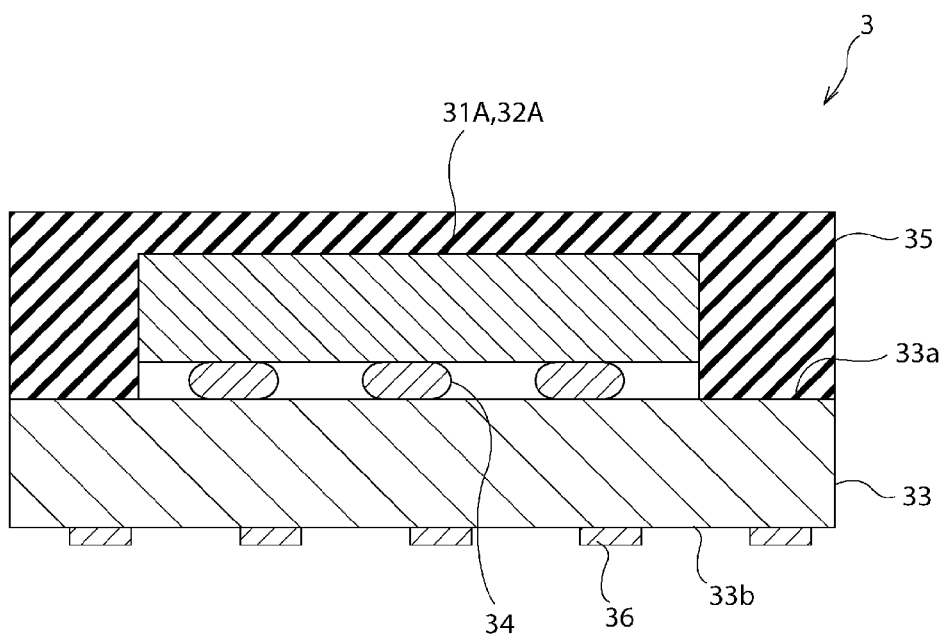
FIG. 4 is a schematic sectional view of a duplexer in a duplexer module of a preferred embodiment of the present invention.

FIG. 3 is a schematic circuit diagram of the duplexer 3 in the duplexer module 1 of the present preferred embodiment. FIG. 4 is a schematic sectional view of the duplexer 3 in the duplexer module 1 of the present preferred embodiment.

As shown in FIG. 3, the duplexer 3 includes a reception filter 31 and a transmission filter 32. The reception filter 31 preferably is a longitudinally coupled resonator-type surface acoustic wave filter having a balanced-unbalanced transforming function. That is, the duplexer 3 includes a filter portion having a balanced-unbalanced transforming function.

The transmission filter 32 preferably is a ladder surface acoustic wave filter. The duplexer 3 includes an antenna terminal 3a, a transmission terminal 3b, and reception terminals 3c1 and 3c2. An input terminal of the reception filter 31 and an output terminal of the transmission filter 32 are connected to the antenna terminal 3a. An input terminal of the transmission filter 32 is connected to the transmission terminal 3b. Output terminals of the reception filter 31 are connected to the reception terminals 3c1 and 3c2. The reception terminal 3c1 is a first balanced terminal, and the reception terminal 3c2 is a second balanced terminal.

As shown in FIG. 4, the duplexer 3 includes a wiring board 33, a reception-side surface acoustic wave filter chip 31A, and a transmission-side surface acoustic wave filter chip 32A. The reception-side surface acoustic wave filter chip 31A and the transmission-side surface acoustic wave filter chip 32A are flip-chip-mounted on a die attach surface 33a of the wiring board 33 preferably via bumps 34. A sealing resin 35 is arranged on the wiring board 33 so as to cover the reception-side surface acoustic wave filter chip 31A and the transmission-side surface acoustic wave filter chip 32A. That is, the duplexer 3 preferably is a CSP (Chip Size Package) surface acoustic wave device. The wiring board 33 is a resin-made printed wiring multilayered board or a ceramic multilayered board. In the duplexer 3, the reception filter 31 is provided in the reception-side surface acoustic wave filter chip 31A, and the transmission filter 32 is provided in the transmission-side surface acoustic wave filter chip 32A. In the duplexer 3, back surface terminals 36 are located on a back surface 33b of the wiring board 33.

Figure 5:
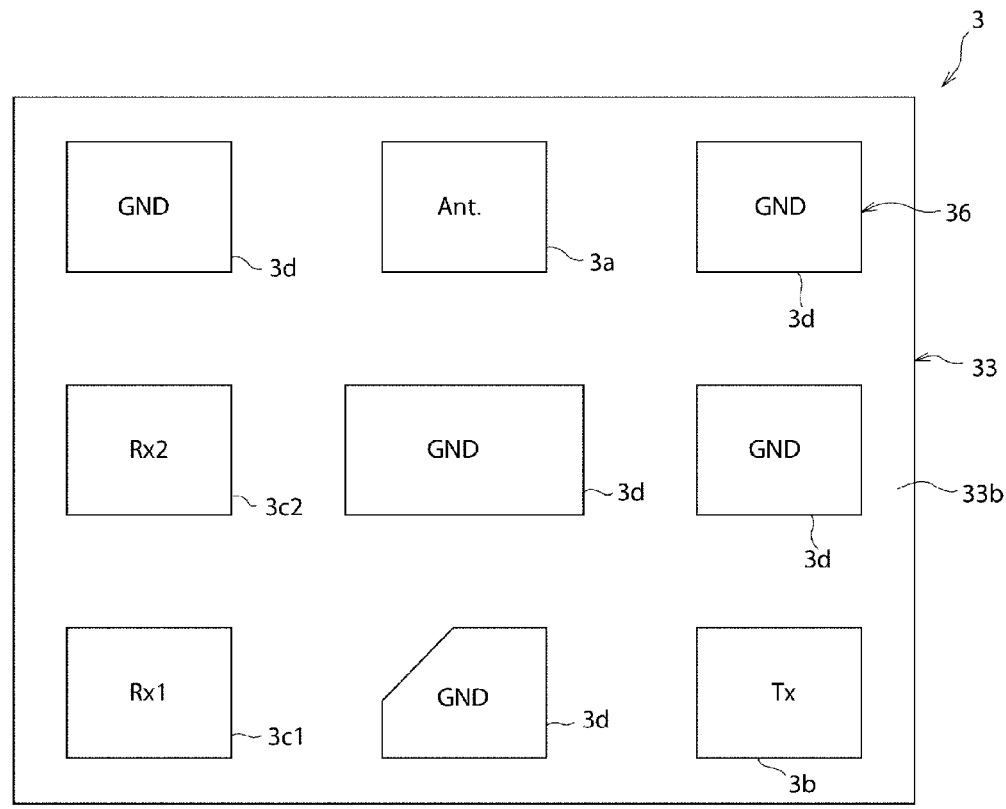
FIG. 5 is a perspective plan view of back surface terminals of a duplexer in a duplexer module of a preferred embodiment of the present invention.

FIG. 5 is a perspective plan view of the back surface terminals 36 of the duplexer 3 in the duplexer module 1 of the present preferred embodiment. FIG. 5 shows a state in which the wiring board 33 is seen through from the side on which the reception-side surface acoustic wave filter chip 31A and the transmission-side surface acoustic wave filter chip 32A are mounted. Examples of the back surface terminals 36 are the antenna terminal 3a, the transmission terminal 3b, the reception terminals 3c1 and 3c2, and ground terminals 3d. The ground terminals 3d are used to connect the reception filter 31 and the transmission filter 32 to a ground.

The duplexer 4 preferably is a duplexer corresponding to UMTS-BAND2. The transmission frequency band of UMTS-BAND2 is 1850 MHz to 1910 MHz, and the reception frequency band thereof is 1930 MHz to 1990 MHz. The duplexer 4 is configured similarly to the duplexer 3. That is, the duplexer 4 includes a reception filter and a transmission filter. The reception filter preferably is a longitudinally coupled resonator-type surface acoustic wave filter having a balanced-unbalanced transforming function. That is, the duplexer 4 includes a filter portion having a balanced-unbalanced transforming function. The duplexer 4 includes an antenna terminal 4a, a transmission terminal 4b, and reception terminals 4c1 and 4c2. The duplexer 4 also includes ground terminals to connect the reception filter and the transmission filter to a ground, though such ground terminals are not shown.

The duplexer 5 preferably is a duplexer corresponding to UMTS-BAND5. The transmission frequency band of UMTS-BAND5 is 824 MHz to 849 MHz, and the reception frequency band thereof is 869 MHz to 894 MHz. The duplexer 5 is configured similarly to the duplexer 3. That is, the duplexer 5 includes a reception filter and a transmission filter. The reception filter preferably is a longitudinally coupled resonator-type surface acoustic wave filter having a balanced-unbalanced transforming function. That is, the duplexer 5 includes a filter portion having a balanced-unbalanced transforming function. The duplexer 5 includes an antenna terminal 5a, a transmission terminal 5b, and reception terminals 5c1 and 5c2. The duplexer 5 also includes ground terminals to connect the reception filter and the transmission filter to a ground, though such ground terminals are not shown.

The duplexer 6 preferably is a duplexer corresponding to UMTS-BAND8. The transmission frequency band of UMTS-BAND8 is 880 MHz to 915 MHz, and the reception frequency band thereof is 925 MHz to 960 MHz. The duplexer 6 is configured similarly to the duplexer 3. That is, the duplexer 6 includes a reception filter and a transmission filter. The reception filter preferably is a longitudinally coupled resonator-type surface acoustic wave filter having a balanced-unbalanced transforming function. That is, the duplexer 6 includes a filter portion having a balanced-unbalanced transforming function. The duplexer 6 includes an antenna terminal 6a, a transmission terminal 6b, and reception terminals 6c1 and 6c2. The duplexer 6 also includes ground terminals to connect the reception filter and the transmission filter to a ground, though such ground terminals are not shown.

The reception filter 7 preferably is a reception-side interstage filter corresponding to DCS. The reception frequency band of DCS is 1805 MHz to 1880 MHz. The reception filter 7 preferably is a longitudinally coupled resonator-type surface acoustic wave filter having a balanced-unbalanced transforming function. That is, the reception filter 7 includes a filter portion having a balanced-unbalanced transforming function. The reception filter 7 includes an input terminal 7a and output terminals 7b1 and 7b2. The reception filter 7 also includes ground terminals, though such ground terminals are not shown. As well as the duplexer 3, the reception filter 7 preferably is a CSP surface acoustic wave device.

Figure 6:
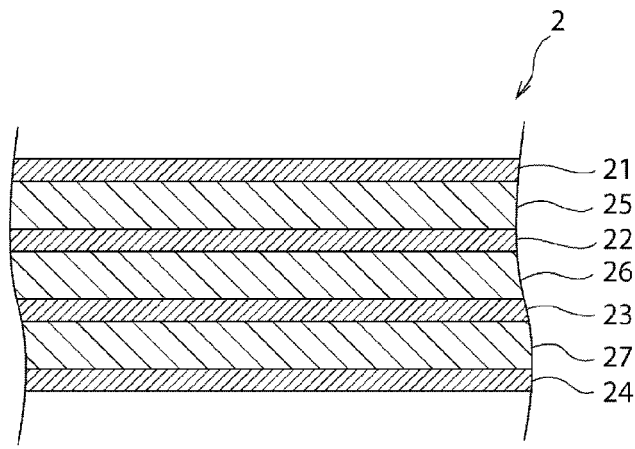
FIG. 6 is a simplified sectional view illustrating a portion of a mount board in a duplexer module of a preferred embodiment of the present invention.

FIG. 6 is a simplified sectional view illustrating a portion of the mount board 2 in the duplexer module 1 of the present preferred embodiment. As shown in FIG. 6, the mount board 2 includes first, second, third and fourth electrode layers 21 through 24 and first, second and third dielectric layers 25 through 27. In the mount board 2, these electrode layers and dielectric layers are alternately stacked. More specifically, from the top, the first electrode layer 21, the first dielectric layer 25, the second electrode layer 22, the second dielectric layer 26, the third electrode layer 23, the third dielectric layer 27, and the fourth electrode layer 24 are sequentially stacked on each other. That is, among the first, second, third and fourth electrode layers 21 through 24 and the first, second and third dielectric layers 25 through 27, the first electrode layer 21 is located on the topmost side, and the fourth electrode layer 24 is located on the bottommost side.

The mount board 2 is a printed wiring multilayered board. The first, second, third and fourth electrode layers 21 through 24 preferably are made of a metal, such as Cu. The first, second and third dielectric layers 25 through 27 are made of, for example, a resin.

Figure 7:
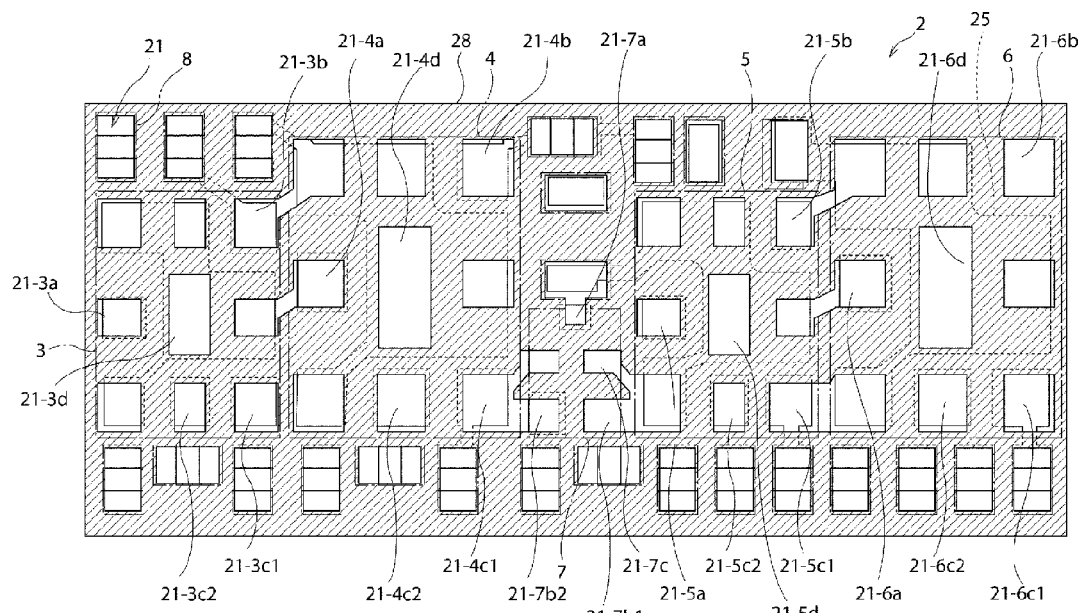
FIG. 7 is a perspective plan view schematically illustrating a mount board in a duplexer module of a preferred embodiment of the present invention.
Figure 8:
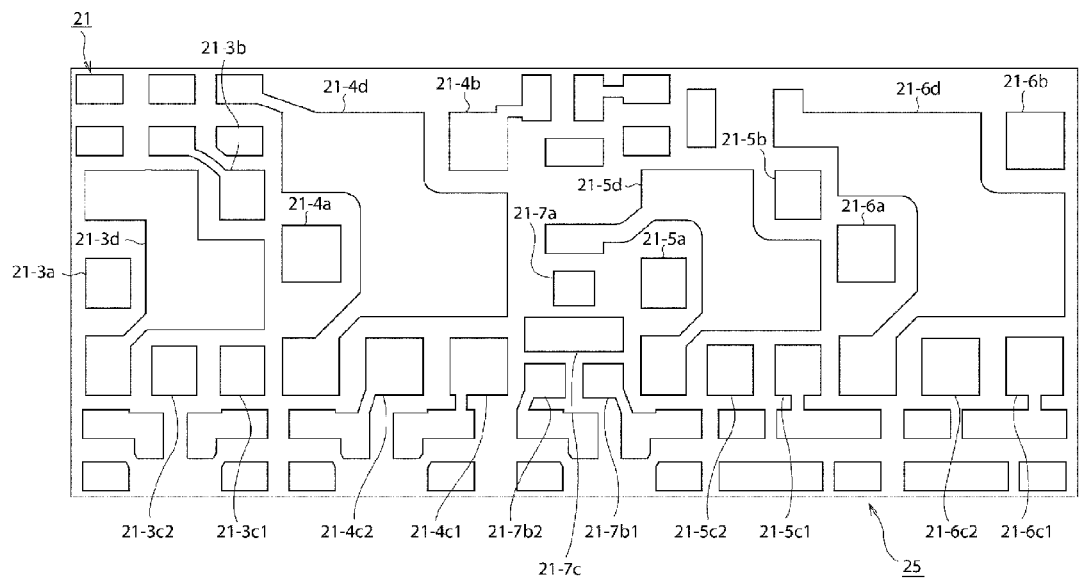
FIG. 8 is a perspective plan view schematically illustrating a first electrode layer and a first dielectric layer of a mount board in a duplexer module of a preferred embodiment of the present invention.
Figure 9:
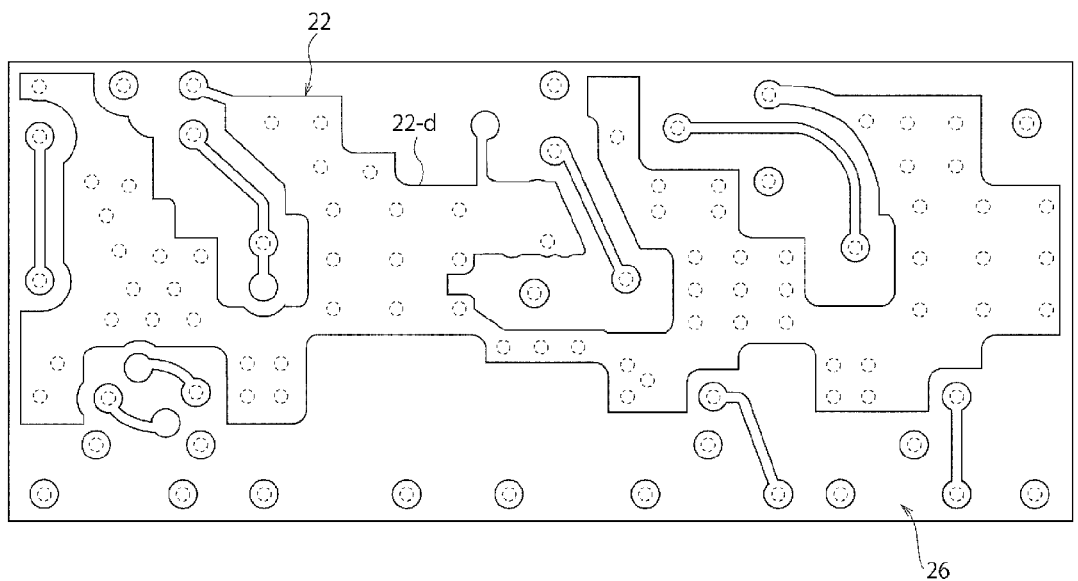
FIG. 9 is a perspective plan view schematically illustrating a second electrode layer and a second dielectric layer of a mount board in a duplexer module of a preferred embodiment of the present invention.
Figure 10:
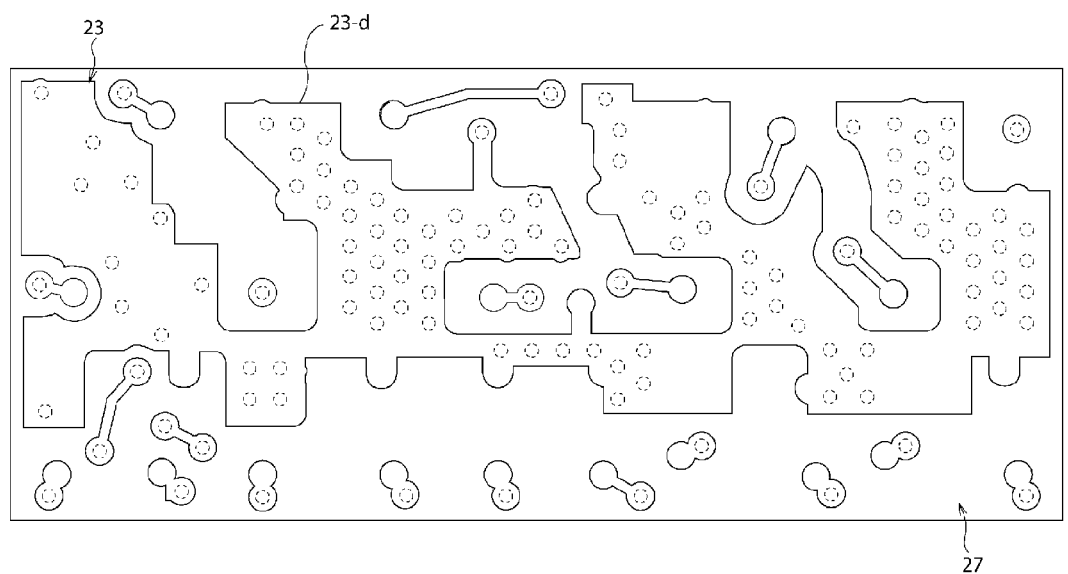
FIG. 10 is a perspective plan view schematically illustrating a third electrode layer and a third dielectric layer of a mount board in a duplexer module of a preferred embodiment of the present invention.
Figure 11:
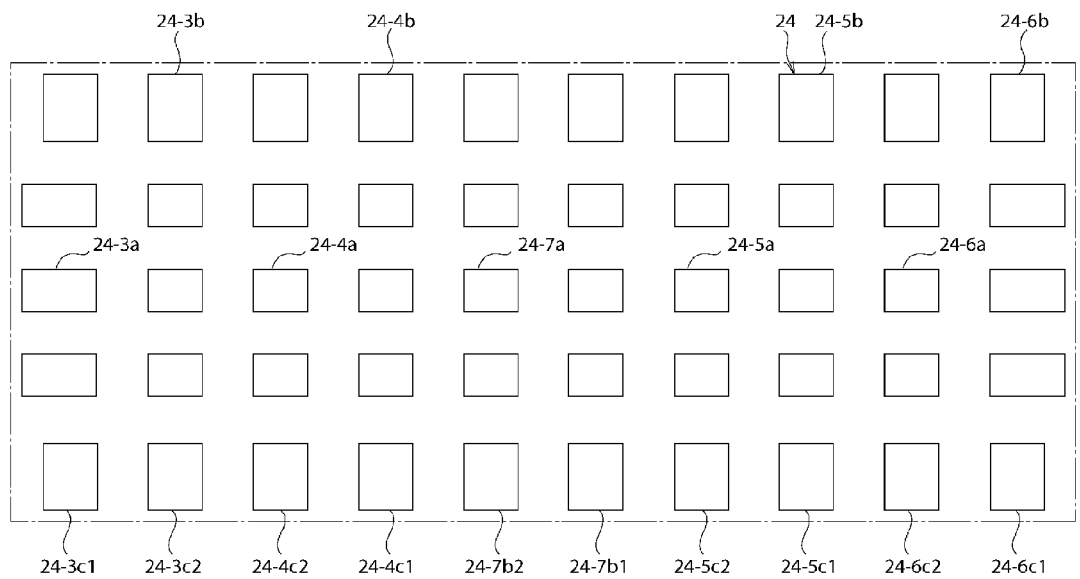
FIG. 11 is a perspective plan view schematically illustrating a fourth electrode layer of a mount board in a duplexer module of a preferred embodiment of the present invention.

FIG. 7 is a perspective plan view schematically illustrating the mount board 2 in the duplexer module 1 of this preferred embodiment. FIG. 8 is a perspective plan view schematically illustrating the first electrode layer 21 and the first dielectric layer 25 of the mount board 2 in the duplexer module 1 of this preferred embodiment. FIG. 9 is a perspective plan view schematically illustrating the second electrode layer 22 and the second dielectric layer 26 of the mount board 2 in the duplexer module 1 of this preferred embodiment. FIG. 10 is a perspective plan view schematically illustrating the third electrode layer 23 and the third dielectric layer 27 of the mount board 2 in the duplexer module 1 of this preferred embodiment. FIG. 11 is a perspective plan view schematically illustrating the fourth electrode layer 24 of the mount board 2 in the duplexer module 1 of this preferred embodiment. FIGS. 7 through 11 show a state in which the mount board 2 is seen through from the side on which the duplexers 3, 4, 5, and 6, the reception filter 7, and the chip components 8 are mounted.

As shown in FIG. 7, on the mount board 2, a resist layer 28 is arranged so as to cover a portion of the first electrode layer 21. In FIG. 7, regions in which the duplexers 3, 4, 5, and 6, the reception filter 7, and the chip components 8 are disposed are indicated by the long dashed dotted lines.

As shown in FIG. 8, the first electrode layer 21 is a mount electrode layer including a plurality of mount electrodes. As shown in FIG. 9, the second electrode layer 22 is an internal electrode layer including a plurality of internal electrodes. As shown in FIG. 10, the third electrode layer 23 is an internal electrode layer including a plurality of internal electrodes. The third electrode layer 23, which is an internal electrode layer, opposes the first electrode layer 21, which is a mount electrode layer, with the first dielectric layer 25, the second electrode layer 22, and the second dielectric layer 26, therebetween. As shown in FIG. 11, the fourth electrode layer 24 is a terminal electrode layer including a plurality of terminal electrodes.

In FIGS. 9 through 11, via-hole electrodes are indicated by circles. Via-hole electrodes connect between the mount electrodes of the first electrode layer 21 and the internal electrodes of the second electrode layer 22, between the internal electrodes of the second electrode layer 22 and the internal electrodes of the third electrode layer 23, and between the internal electrodes of the third electrode layer 23 and the terminal electrodes of the fourth electrode layer 24.

As shown in FIGS. 7 and 8, the first electrode layer 21 includes mount electrodes 21-3a, 21-3b, 21-3c1, 21-3c2, 21-3d, 21-4a, 21-4b, 21-4c1, 21-4c2, 21-4d, 21-5a, 21-5b, 21-5c1, 21-5c2, 21-5d, 21-6a, 21-6b, 21-6c1, 21-6c2, 21-6d, 21-7a, 21-7b1, 21-7b2, and 21-7c.

The mount electrode 21-3a is connected to the antenna terminal 3a of the duplexer 3. The mount electrode 21-3b is connected to the transmission terminal 3b of the duplexer 3. The mount electrode 21-3c1 is connected to the reception terminal 3c1 of the duplexer 3. The mount electrode 21-3c2 is connected to the reception terminal 3c2 of the duplexer 3. The mount electrode 21-3d is connected to the ground terminals 3d of the duplexer 3. The mount electrode 21-3c1 is a first balanced mount electrode, which is connected to the reception terminal 3c1 of the duplexer 3, which is the first balanced terminal. The mount electrode 21-3c2 is a second balanced mount electrode, which is connected to the reception terminal 3c2 of the duplexer 3, which is the second balanced terminal.

The mount electrode 21-4a is connected to the antenna terminal 4a of the duplexer 4. The mount electrode 21-4b is connected to the transmission terminal 4b of the duplexer 4. The mount electrode 21-4c1 is connected to the reception terminal 4c1 of the duplexer 4. The mount electrode 21-4c2 is connected to the reception terminal 4c2 of the duplexer 4. The mount electrode 21-4d is connected to ground terminals of the duplexer 4, which are not shown.

The mount electrode 21-5a is connected to the antenna terminal 5a of the duplexer 5. The mount electrode 21-5b is connected to the transmission terminal 5b of the duplexer 5. The mount electrode 21-5c1 is connected to the reception terminal 5c1 of the duplexer 5. The mount electrode 21-5c2 is connected to the reception terminal 5c2 of the duplexer 5. The mount electrode 21-5d is connected to ground terminals of the duplexer 5, which are not shown.

The mount electrode 21-6a is connected to the antenna terminal 6a of the duplexer 6. The mount electrode 21-6b is connected to the transmission terminal 6b of the duplexer 6. The mount electrode 21-6c1 is connected to the reception terminal 6c1 of the duplexer 6. The mount electrode 21-6c2 is connected to the reception terminal 6c2 of the duplexer 6. The mount electrode 21-6d is connected to ground terminals of the duplexer 6, which are not shown.

The mount electrode 21-7a is connected to the input terminal 7a of the reception filter 7. The mount electrode 21-7b1 is connected to the output terminal 7b1 of the reception filter 7. The mount electrode 21-7b2 is connected to the output terminal 7b2 of the reception filter 7. The mount electrode 21-7c is connected to ground terminals of the reception filter 7, which are not shown.

The other mount electrodes of the first electrode layer are connected to the terminal electrodes of the chip components 8.

As shown in FIG. 9, the second electrode layer 22 includes an internal electrode 22-d. The internal electrode 22-d is connected to the mount electrodes 21-3d, 21-4d, 21-5d, 21-6d, and 21-7c of the first electrode layer 21 by via-hole electrodes. The internal electrode 22-d is a ground electrode, which is connected to a ground.

As shown in FIG. 10, the third electrode layer 23 includes an internal electrode 23-d. The internal electrode 23-d is connected to the internal electrode 22-d of the second electrode layer 22 by via-hole electrodes. The internal electrode 23-d is a ground electrode, which is connected to a ground, and is a first internal ground electrode.

As shown in FIG. 11, the fourth electrode layer 24 includes terminal electrodes 24-3a, 24-3b, 24-3c1, 24-3c2, 24-4a, 24-4b, 24-4c1, 24-4c2, 24-5a, 24-5b, 24-5c1, 24-5c2, 24-6a, 24-6b, 24-6c1, 24-6c2, 24-7a, 24-7b1, and 24-7b2.

The terminal electrode 24-3a is connected to the mount electrode 21-3a of the first electrode layer 21 with the internal electrodes of the second electrode layer 22 and the internal electrodes of the third electrode layer 23 therebetween. That is, the terminal electrode 24-3a is connected to the antenna terminal 3a of the duplexer 3. The terminal electrode 24-3a is also an antenna terminal electrode, which is connected to an antenna of a communication device.

The terminal electrode 24-3b is connected to the mount electrode 21-3b of the first electrode layer 21 with the internal electrodes of the second electrode layer 22 and the internal electrodes of the third electrode layer 23 therebetween. That is, the terminal electrode 24-3b is connected to the transmission terminal 3b of the duplexer 3. The terminal electrode 24-3b is also a transmission terminal electrode, which is connected to an RFIC of a communication device.

The terminal electrode 24-3c1 is connected to the mount electrode 21-3c1 of the first electrode layer 21 with the internal electrodes of the second electrode layer 22 and the internal electrodes of the third electrode layer 23 therebetween. That is, the terminal electrode 24-3c1 is connected to the reception terminal 3c1 of the duplexer 3. The terminal electrode 24-3c1 is a first balanced terminal electrode, which is connected to the mount electrode 21-3c1, which is the first balanced mount electrode. The terminal electrode 24-3c1 is also a first reception terminal electrode, which is connected to an RFIC of a communication device.

The terminal electrode 24-3c2 is connected to the mount electrode 21-3c2 of the first electrode layer 21 with the internal electrodes of the second electrode layer 22 and the internal electrodes of the third electrode layer 23 therebetween. That is, the terminal electrode 24-3c2 is connected to the reception terminal 3c2 of the duplexer 3. The terminal electrode 24-3c2 is a second balanced terminal electrode, which is connected to the mount electrode 21-3c2, which is the second balanced mount electrode. The terminal electrode 24-3c2 is also a second reception terminal electrode, which is connected to an RFIC of a communication device.

The terminal electrode 24-4a is connected to the mount electrode 21-4a of the first electrode layer 21 with the internal electrodes of the second electrode layer 22 and the internal electrodes of the third electrode layer 23 therebetween. The terminal electrode 24-4b is connected to the mount electrode 21-4b of the first electrode layer 21 with the internal electrodes of the second electrode layer 22 and the internal electrodes of the third electrode layer 23 therebetween. The terminal electrode 24-4c1 is connected to the mount electrode 21-4c1 of the first electrode layer 21 with the internal electrodes of the second electrode layer 22 and the internal electrodes of the third electrode layer 23 therebetween. The terminal electrode 24-4c2 is connected to the mount electrode 21-4c2 of the first electrode layer 21 with the internal electrodes of the second electrode layer 22 and the internal electrodes of the third electrode layer 23 therebetween.

The terminal electrode 24-5*a* is connected to the mount electrode 21-5*a* of the first electrode layer 21 with the internal electrodes of the second electrode layer 22 and the internal electrodes of the third electrode layer 23 therebetween. The terminal electrode 24-5*b* is connected to the mount electrode 21-5*b* of the first electrode layer 21 with the internal electrodes of the second electrode layer 22 and the internal electrodes of the third electrode layer 23 therebetween. The terminal electrode 24-5*c*1 is connected to the mount electrode 21-5*c*1 of the first electrode layer 21 with the internal electrodes of the second electrode layer 22 and the internal electrodes of the third electrode layer 23 therebetween. The terminal electrode 24-5*c*2 is connected to the mount electrode 21-5*c*2 of the first electrode layer 21 with the internal electrodes of the second electrode layer 22 and the internal electrodes of the third electrode layer 23 therebetween.

The terminal electrode 24-6*a* is connected to the mount electrode 21-6*a* of the first electrode layer 21 with the internal electrodes of the second electrode layer 22 and the internal electrodes of the third electrode layer 23 therebetween. The terminal electrode 24-6*b* is connected to the mount electrode 21-6*b* of the first electrode layer 21 with the internal electrodes of the second electrode layer 22 and the internal electrodes of the third electrode layer 23 therebetween. The terminal electrode 24-6*c*1 is connected to the mount electrode 21-6*c*1 of the first electrode layer 21 with the internal electrodes of the second electrode layer 22 and the internal electrodes of the third electrode layer 23 therebetween. The terminal electrode 24-6*c*2 is connected to the mount electrode 21-6*c*2 of the first electrode layer 21 with the internal electrodes of the second electrode layer 22 and the internal electrodes of the third electrode layer 23 therebetween.

The terminal electrode 24-7*a* is connected to the mount electrode 21-7*a* of the first electrode layer 21 with the internal electrodes of the second electrode layer 22 and the internal electrodes of the third electrode layer 23 therebetween. The terminal electrode 24-7*b*1 is connected to the mount electrode 21-7*b*1 of the first electrode layer 21 with the internal electrodes of the second electrode layer 22 and the internal electrodes of the third electrode layer 23 therebetween. The terminal electrode 24-7*b*2 is connected to the mount electrode 21-7*b*2 of the first electrode layer 21 with the internal electrodes of the second electrode layer 22 and the internal electrodes of the third electrode layer 23 therebetween.

The other terminal electrodes of the fourth electrode layer 24 are connected to the internal electrode 23-*d* of the third electrode layer 23 by via-hole electrodes. The other terminals of the fourth electrode layer 24 are ground terminal electrodes, which are connected to a ground.

In the duplexer module 1 of this preferred embodiment, the length of a signal path between the first balanced mount electrode and the first balanced terminal electrode is different from that between the second balanced mount electrode and the second balanced terminal electrode. That is, in the duplexer module 1 of this preferred embodiment, the length of a signal path between the mount electrode 21-3*c*1 of the first electrode layer 21 and the terminal electrode 24-3*c*1 of the fourth electrode layer 24 is different from that between the mount electrode 21-3*c*2 of the first electrode layer 21 and the terminal electrode 24-3*c*2 of the fourth electrode layer 24. The signal path includes the internal electrodes of the second electrode layer 22, the internal electrodes of the third electrode layer 23, and the via-hole electrodes.

In the duplexer module 1 of this preferred embodiment, when viewing the mount board from the side on which the filter components are mounted, it can be seen that the area along which the first balanced mount electrode and the first internal ground electrode oppose each other is different from the area along which the second balanced mount electrode and the first internal ground electrode oppose each other. That is, in the duplexer module 1 of this preferred embodiment, when viewing the mount board 2 from the side on which the duplexer 3 is mounted, it can be seen that the area along which the mount electrode 21-3*c*1 of the first electrode layer 21 and the internal electrode 23-*d* of the third electrode layer 23 oppose each other is different from the area along which the mount electrode 21-3*c*2 of the first electrode layer 21 and the internal electrode 23-*d* of the third electrode layer 23 oppose each other. More specifically, when viewing the mount board 2 from the side on which the duplexer 3 is mounted, the internal electrode 23-*d* is located under the mount electrode 21-3*c*1, and thus, the mount electrode 21-3*c*1 includes a portion which opposes the internal electrode 23-*d*. In contrast, when viewing the mount board 2 from the side on which the duplexer 3 is mounted, the internal electrode 23-*d* is not located under the mount electrode 21-3*c*2, and thus, the mount electrode 21-3*c*2 does not include a portion which opposes the internal electrode 23-*d*.

In other words, in the duplexer module 1 of this preferred embodiment, when viewing the mount board from the side on which the filter components are mounted, it can be seen that the area along which the first balanced mount electrode and the first internal ground electrode overlap each other is different from the area along which the second balanced mount electrode and the first internal ground electrode overlap each other. That is, in the duplexer module 1 of this preferred embodiment, when viewing the mount board 2 from the side on which the duplexer 3 is mounted, it can be seen that the area along which the mount electrode 21-3*c*1 of the first electrode layer 21 and the internal electrode 23-*d* of the third electrode layer 23 overlap each other is different from the area along which the mount electrode 21-3*c*2 of the first electrode layer 21 and the internal electrode 23-*d* of the third electrode layer 23 overlap each other. More specifically, when viewing the mount board 2 from the side on which the duplexer 3 is mounted, the internal electrode 23-*d* is located under the mount electrode 21-3*c*1, and thus, the mount electrode 21-3*c*1 includes a portion which overlaps the internal electrode 23-*d*. In contrast, when viewing the mount board 2 from the side on which the duplexer 3 is mounted, the internal electrode 23-*d* is not located under the mount electrode 21-3*c*2, and thus, the mount electrode 21-3*c*2 does not include a portion which overlaps the internal electrode 23-*d*.

With this configuration, in the duplexer module 1 of this preferred embodiment, phase balance characteristics of reception signals output from the terminal electrodes 24-3*c*1 and 24-3*c*2 are significantly improved. Further, differential isolation characteristics in a transmission band are significantly improved.

A comparative example, which is to be compared with the duplexer module 1 of this preferred embodiment, was prepared. In a duplexer module of the comparative example, when viewing the mount board 2 from the side on which the duplexer 3 is mounted, the internal electrode 23-*d* is located under both of the mount electrode 21-3*c*1 and the mount electrode 21-3*c*2, and thus, both of the mount electrode 21-3*c*1 and the mount electrode 21-3*c*2 entirely oppose the internal electrode 23-*d*. With this configuration, when viewing the mount board 2 from the side on which the duplexer 3 is mounted, it can be seen that the area along which the mount electrode 21-3*c*1 and the internal electrode 23-*d* oppose each other is equal to the area along which the mount electrode 21-3*c*2 and the internal electrode 23-*d* oppose each other. The configuration of the duplexer module of the comparative example is the same as that of the duplexer module 1 of this preferred embodiment, except for the shape of the internal electrode 23-$d$ of the third electrode layer 23.

Electrical characteristics of the duplexer module 1 of this preferred embodiment and those of the duplexer module of the comparative example were measured.

Figure 12:
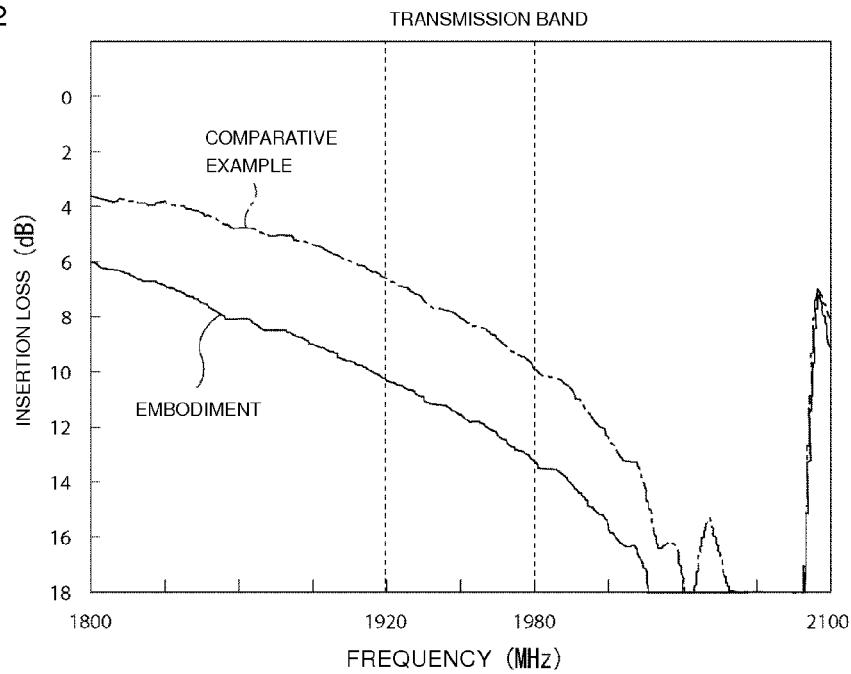
FIG. 12 is a graph illustrating transmission characteristics concerning a signal flowing between a first reception terminal electrode and a second reception terminal electrode of a duplexer module of a preferred embodiment of the present invention, and those of a duplexer module of a comparative example.

FIG. 12 illustrates transmission characteristics concerning a signal flowing between the terminal electrode 24-3$c$1, which is the first reception terminal electrode, and the terminal electrode 24-3$c$2, which is the second reception terminal electrode, of the duplexer module 1 of this preferred embodiment, and those of the duplexer module of the comparative example. As shown in FIG. 12, in the duplexer module 1 of this preferred embodiment, a large attenuation occurs in a transmission frequency band (1920 MHz to 1980 MHz) of UMTS-BAND1 used in the duplexer 3.

Figure 13:
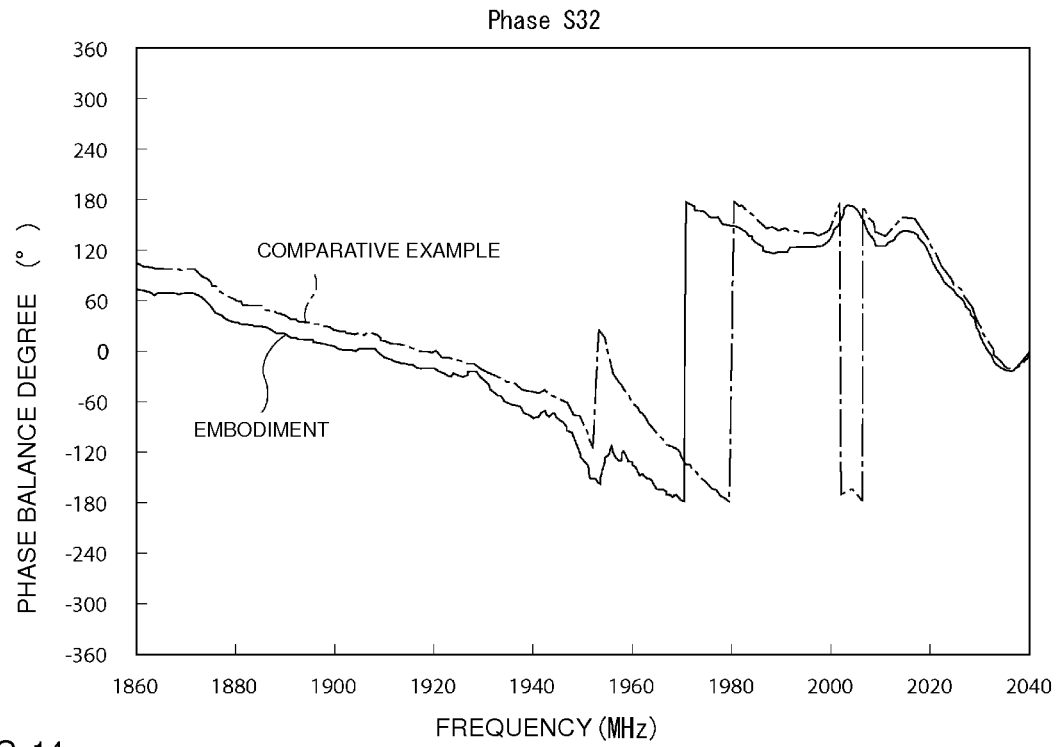
FIG. 13 is a graph illustrating phase characteristics concerning a signal flowing between a transmission terminal electrode and a first reception terminal electrode of a duplexer module of a preferred embodiment of the present invention, and those of a duplexer module of a comparative example.
Figure 14:
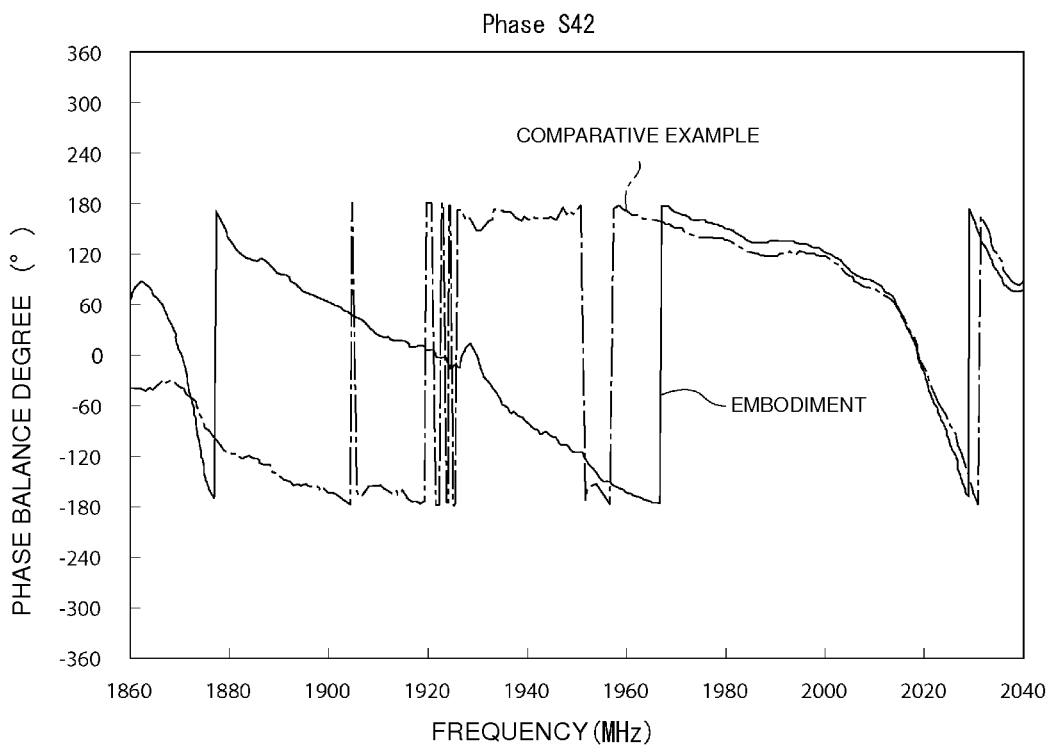
FIG. 14 is a graph illustrating phase characteristics concerning a signal flowing between a transmission terminal electrode and a second reception terminal electrode of a duplexer module of a preferred embodiment of the present invention, and those of a duplexer module of a comparative example.
Figure 15:
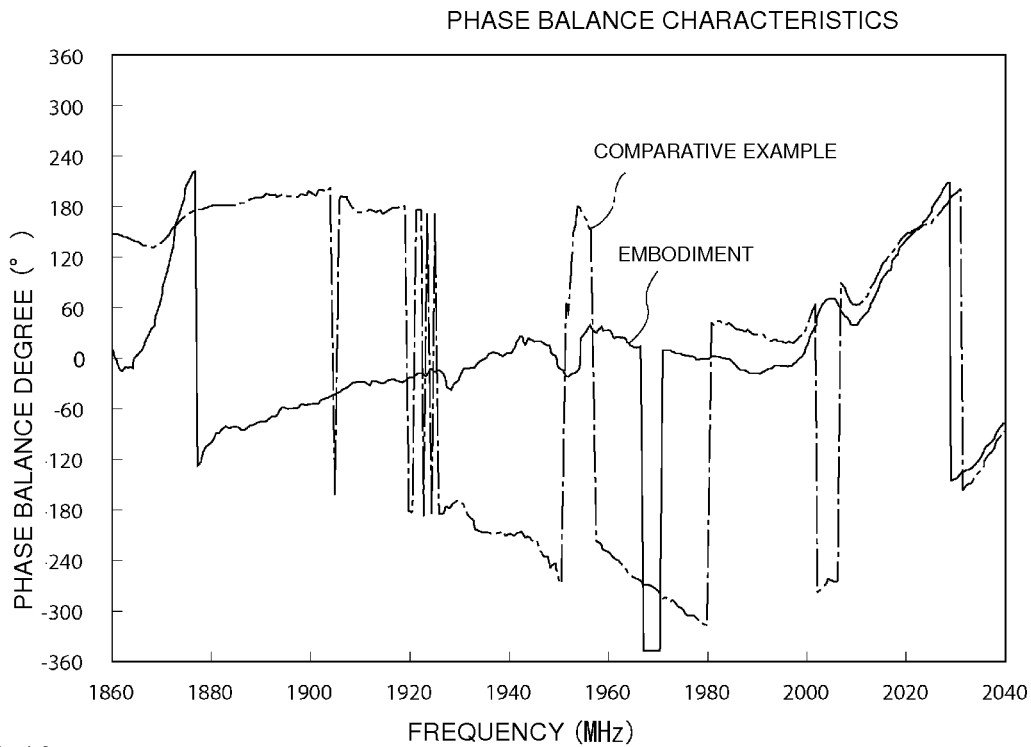
FIG. 15 is a graph illustrating phase balance characteristics indicating the difference between phase characteristics concerning a signal flowing between the transmission terminal electrode and the first reception terminal electrode shown in FIG. 13 and phase characteristics concerning a signal flowing between the transmission terminal electrode and the second reception terminal electrode shown in FIG. 14.

FIG. 13 illustrates phase characteristics concerning a signal flowing between the terminal electrode 24-3$b$, which is the transmission terminal electrode, and the terminal electrode 24-3$c$1, which is the first reception terminal electrode, of the duplexer module 1 of this preferred embodiment, and those of the duplexer module of the comparative example. FIG. 14 illustrates phase characteristics concerning a signal flowing between the terminal electrode 24-3$b$, which is the transmission terminal electrode, and the terminal electrode 24-3$c$2, which is the second reception terminal electrode, of the duplexer module 1 of this preferred embodiment, and those of the duplexer module of the comparative example. FIG. 15 illustrates phase balance characteristics concerning the difference between the phase characteristics concerning a signal flowing between the transmission terminal electrode and the first reception terminal electrode shown in FIG. 13 and the phase characteristics concerning a signal flowing between the transmission terminal electrode and the second reception terminal electrode shown in FIG. 14.

FIGS. 13 and 14 show that, in the duplexer module of the comparative example, in the transmission frequency band (1920 MHz to 1980 MHz) of UMTS-BAND1 used in the duplexer 3, the phase characteristics concerning a signal flowing between the transmission terminal electrode and the first reception terminal electrode is very different from that between the transmission terminal electrode and the second reception terminal electrode. In contrast, FIGS. 13 and 14 show that, in the duplexer module 1 of this preferred embodiment, the above-described two phase characteristics are very similar. As a result, as shown in FIG. 15, in the duplexer module 1 of this preferred embodiment, in the transmission frequency band (1920 MHz to 1980 MHz) of UMTS-BAND1 preferably used in the duplexer 3, the phase balance characteristics are indicated by around 0°, thus exhibiting excellent phase balance characteristics.

Figure 16:
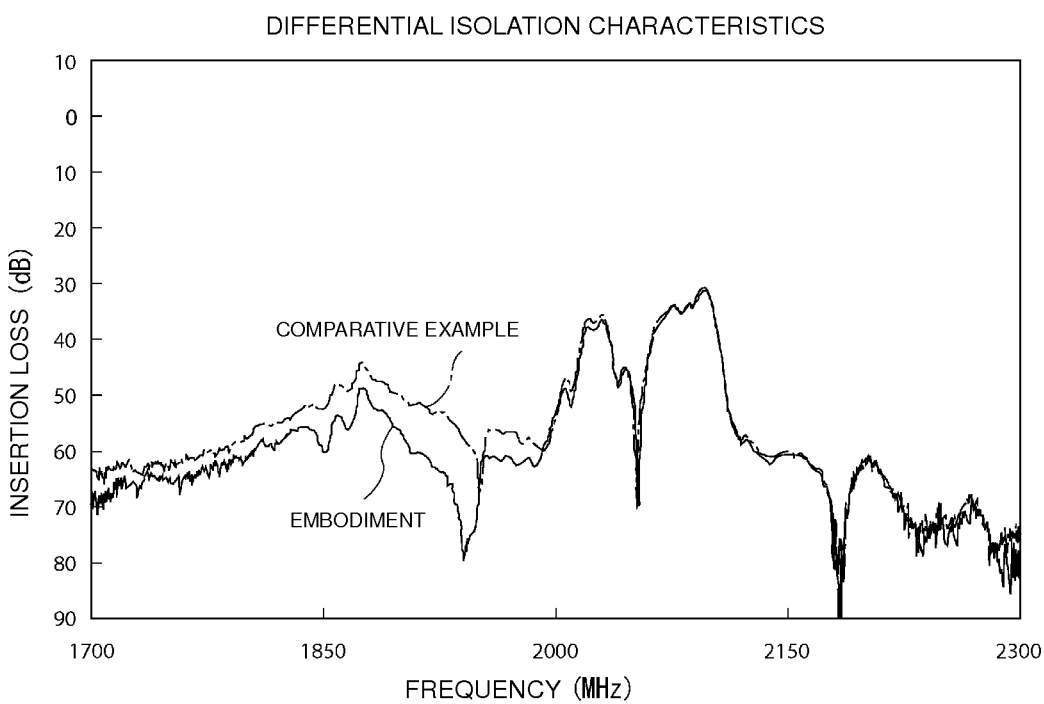
FIG. 16 illustrates differential isolation characteristics concerning differential isolation between a transmission terminal electrode and each of a first reception terminal electrode and a second reception terminal electrode of a duplexer module of a preferred embodiment of the present invention, and those of a duplexer module of a comparative example.
Figure 17:
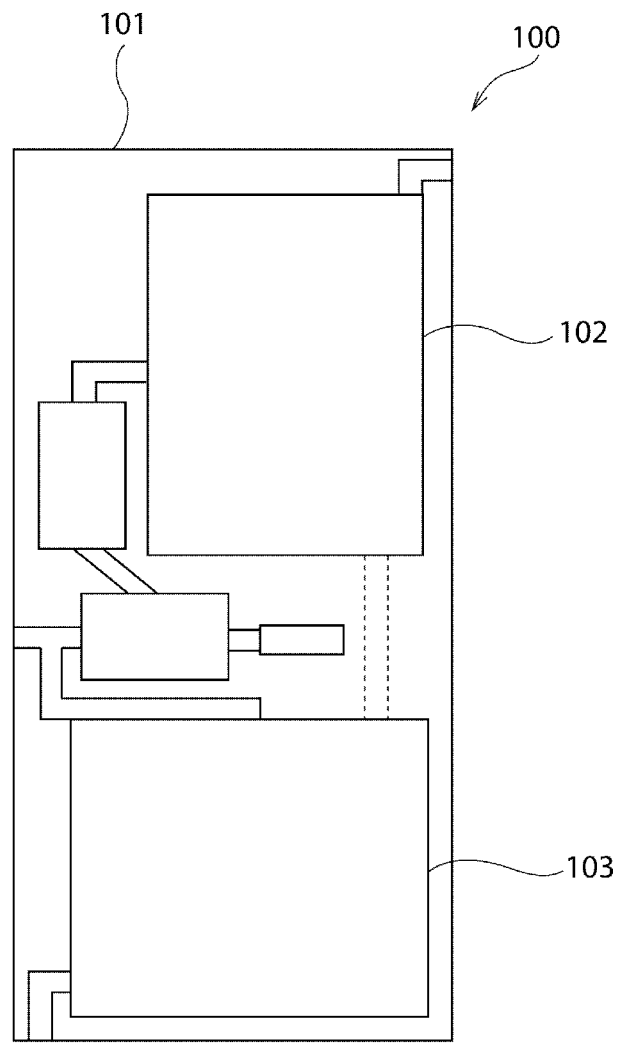
FIG. 17 is a schematic plan view of a duplexer module disclosed in Japanese Unexamined Patent Application Publication No. 2010-45563.

FIG. 16 illustrates differential isolation characteristics concerning differential isolation between the terminal electrode 24-3$b$, which is the transmission terminal electrode, and the terminal electrode 24-3$c$1, which is the first reception terminal electrode, and between the terminal electrode 24-3$b$ and the terminal electrode 24-3$c$2, which is the second reception terminal electrode, of the duplexer module 1 of this preferred embodiment, and those of the duplexer module of the comparative example. As shown in FIG. 16, in the duplexer module 1 of this preferred embodiment, a large attenuation occurs in a transmission frequency band (1920 MHz to 1980 MHz) of UMTS-BAND1 used in the duplexer 3, thus exhibiting excellent differential isolation characteristics.

The principle that excellent phase balance characteristics are obtained in the duplexer module 1 of this preferred embodiment will be discussed below.

In the duplexer module 1, the length of a signal path between the mount electrode 21-3$c$1 (first balanced mount electrode) of the first electrode layer 21 and the terminal electrode 24-3$c$1 (first balanced terminal electrode) of the fourth electrode layer 24 is different from that between the mount electrode 21-3$c$2 (second balanced mount electrode) of the first electrode layer 21 and the terminal electrode 24-3$c$2 (second balanced terminal electrode) of the fourth electrode layer 24.

Because of this difference between the lengths of the signal paths, the difference between phase characteristics of a reception signal output from the reception terminal 3$c$1 (first balanced terminal) of the duplexer 3 and those of a reception signal output from the reception terminal 3$c$2 (second balanced terminal) of the duplexer 3 considerably deviates from 0°.

In the duplexer module 1, the area along which the mount electrode 21-3$c$1 (first balanced mount electrode) of the first electrode layer 21 and the internal electrode 23-$d$ (first internal ground electrode) of the third electrode layer 23 oppose each other is different from the area along which the mount electrode 21-3$c$2 (second balanced mount electrode) of the first electrode layer 21 and the internal electrode 23-$d$ (first internal ground electrode) of the third electrode layer 23 oppose each other. Accordingly, the capacitance generated between the mount electrode 21-3$c$1 (first balanced mount electrode) of the first electrode layer 21 and the internal electrode 23-$d$ (first internal ground electrode) of the third electrode layer 23 is different from the capacitance generated between the mount electrode 21-3$c$2 (second balanced mount electrode) of the first electrode layer 21 and the internal electrode 23-$d$ (first internal ground electrode) of the third electrode layer 23. This difference in the capacitance compensates for the above-described difference in the phase characteristics, so as to implement excellent phase balance characteristics.

One of the ways to make the area along which the first balanced mount electrode and the first internal ground electrode oppose each other different from the area along which the second balanced mount electrode and the first internal ground electrode oppose each other may be that one of the first and second balanced mount electrodes is made smaller than the other one of the second and first balanced mount electrodes. However, in order to mount a filter component in a suitable manner, it is necessary that the first and second balanced mount electrodes be made large to a certain degree. In the above-described measure, therefore, it may be difficult for the area along which the first balanced mount electrode and the first internal ground electrode oppose each other to be made sufficiently different from the area along which the second balanced mount electrode and the first internal ground electrode oppose each other. Thus, it is preferable that, by appropriately adjusting the shape and the position of the first internal ground electrode, the area along which the first balanced mount electrode and the first internal ground electrode oppose each other is made sufficiently different from the area along which the second balanced mount electrode and the first internal ground electrode oppose each other.

In the duplexer module 1 of this preferred embodiment, when viewing the mount board 2 from the side on which the duplexer 3 is mounted, the internal electrode 23-$d$ is located under the mount electrode 21-3$c$1, and thus, the mount electrode 21-3$c$1 includes a portion which opposes the internal electrode 23-$d$. In contrast, when viewing the mount board 2 from the side on which the duplexer 3 is mounted, the internal electrode 23-*d* is not located under the mount electrode 21-3*c*2, and thus, the mount electrode 21-3*c*2 does not include a portion which opposes the internal electrode 23-*d*. However, the present invention is not restricted to this configuration.

In the present invention, the area along which the first balanced mount electrode and the first internal ground electrode oppose each other may be made different from the area along which the second balanced mount electrode and the first internal ground electrode oppose each other by the following arrangement. When viewing the mount board from the side on which filter components are mounted, the first internal ground electrode is located under both of the first balanced mount electrode and the second balanced mount electrode, and the first balanced mount electrode and the second balanced mount electrode each include a portion which opposes the first internal ground electrode.

With this configuration, too, the capacitance generated between the first balanced mount electrode and the first internal ground electrode is different from that between the second balanced mount electrode and the first internal ground electrode, so as to provide excellent phase balance characteristics.

Alternatively, the area along which the first balanced mount electrode and the first internal ground electrode oppose each other may be made different from the area along which the second balanced mount electrode and the first internal ground electrode oppose each other by the following arrangement. When viewing the mount board from the side on which the filter components are mounted, the first internal ground electrode is located under the first balanced mount electrode, and thus, the first balanced mount electrode includes a portion which opposes the first internal ground electrode. In contrast, when viewing the mount board from the side on which the filter components are mounted, a second internal ground electrode, which is different from the first internal ground electrode, is located under the second balanced mount electrode, and the first balanced mount electrode and the second balanced mount electrode each include a portion which opposes the first internal ground electrode. The second balanced mount electrode includes a portion which opposes the second internal ground electrode, but does not include a portion which opposes the first internal ground electrode. The second internal ground electrode may be provided on the same electrode layer on which the first internal ground electrode is provided, or may be provided on an electrode layer different from that on which the first internal ground electrode is provided.

With this configuration, too, the capacitance generated between the first balanced mount electrode and the first internal ground electrode is different from that between the second balanced mount electrode and the first internal ground electrode, so as to provide excellent phase balance characteristics. Additionally, by changing the area along which the second balanced mount electrode and the second internal ground electrode oppose each other, the capacitance generated between the second balanced mount electrode and the second internal ground electrode may be changed, so as to provide excellent phase balance characteristics more easily.

In the duplexer module 1, the duplexers 3, 4, 5, and 6 and the reception filter 7 are preferably defined by surface acoustic wave filters. However, the present invention is not restricted to this type of filter. The filter components each may preferably be any one of a surface acoustic wave filter, a boundary acoustic wave filter, and a bulk acoustic wave filter.

Additionally, in the duplexer module 1, the reception filter of the duplexer 3 preferably includes a filter portion having a balanced-unbalanced transforming function. However, the present invention is not restricted to this function. Any type of balance-unbalanced function may be used as long as a filter component includes first and second balanced terminals, for example, the filter component may include a balun.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter module comprising:
a mount board that includes a mount electrode layer, an internal electrode layer, a terminal electrode layer, and at least one dielectric layer, and the mount electrode layer, the internal electrode layer, the terminal electrode layer, and the dielectric layer are stacked on each other such that the mount electrode layer is located on a topmost side and the terminal electrode layer is located on a bottommost side; and
at least one filter component that is mounted on a front surface of the mount board and that includes first and second balanced terminals; wherein
the mount electrode layer includes a first balanced mount electrode, which is connected to the first balanced terminal, and a second balanced mount electrode, which is connected to the second balanced terminal;
the internal electrode layer includes a first internal ground electrode;
the first internal ground electrode is opposed to each of the first balanced mount electrode and the second mount electrode in a direction in which the mount electrode layer, the internal electrode layer, the terminal electrode layer, and the dielectric layer are stacked;
the terminal electrode layer includes a first balanced terminal electrode, which is connected to the first balanced mount electrode, and a second balanced terminal electrode, which is connected to the second balanced mount electrode;
a length of a signal path between the first balanced mount electrode and the first balanced terminal electrode is different from a length of a signal path between the second balanced mount electrode and the second balanced terminal electrode; and
when viewing the mount board from a side on which the filter component is mounted, an area along which the first balanced mount electrode and the first internal ground electrode oppose each other is different from an area along which the second balanced mount electrode and the first internal ground electrode oppose each other.

2. The filter module according to claim 1, wherein the filter module is a duplexer module.

3. The filter module according to claim 2, wherein the duplexer module is a chip size package surface acoustic wave device.

4. The filter module according to claim 3, wherein the duplexer module includes a reception-side surface acoustic wave filter chip and a transmission-side surface acoustic wave filter chip.

5. The filter module according to claim 1, wherein the at least one filter component includes a reception filter.

6. The filter module according to claim 5, wherein the reception filter is a longitudinally coupled resonator surface acoustic wave filter arranged to perform a balanced-unbalanced transforming function.

7. The filter module according to claim 5, wherein the reception filter is a surface acoustic wave filter.

8. The filter module according to claim 1, wherein the at least one filter component includes a plurality of duplexers.

9. The filter module according to claim 8, wherein the plurality of duplexers are defined by surface acoustic wave filters.

10. The filter module according to claim 1, further comprising a plurality of electronic chip components mounted on the mount board.

11. The filter module according to claim 10, wherein the plurality of electronic chip components include inductors and capacitors.

12. A communication device comprising:
an RF circuit; and
the filter module according to claim 1 mounted on the RF circuit.

13. The communication device according to claim 12, wherein the communication device is a cellular telephone.

14. The communication device according to claim 12, wherein the at least one filter component is at least one of a surface acoustic wave filter, a boundary acoustic wave filter, and a bulk acoustic wave filter.

15. The filter module according to claim 1, wherein the at least one filter component includes at least one of a surface acoustic wave filter, a boundary acoustic wave filter, and a bulk acoustic wave filter.

16. The filter module according to claim 1, wherein the at least one filter component includes a filter portion arranged to perform a balanced-unbalanced transforming function.

17. The filter module according to claim 1, wherein the filter module is a triplexer module.

18. The filter module according to claim 1, wherein the filter module includes a plurality of interstage filters.

19. The filter module according to claim 1, wherein the filter module has a transmission frequency band of 824 MHz to 849 MHz or 880 MHz to 915 MHz or 1850 MHz to 1910 MHz or 1920 MHz to 1980 MHz, and a reception frequency band of 869 MHz to 894 MHz or 925 MHz to 960 MHz or 1930 MHz to 1990 MHz or 2110 MHz to 2170 MHz.

20. The filter module according to claim 1, wherein the at least one filter component is a transmission filter defined by a ladder surface acoustic wave filter.

\* \* \* \* \*